(12) United States Patent
Bergum (10) Patent No.: US 9,748,744 B2
(45) Date of Patent: Aug. 29, 2017

(54) ELECTRICAL ENCLOSURE WITH INTERCHANGEABLE PEDESTAL MOUNTING SYSTEM

(71) Applicant: S.J. Electro Systems, Inc., Detroit Lakes, MN (US)

(72) Inventor: Alan J. Bergum, Detroit Lakes, MN (US)

(73) Assignee: S.J. Electro Systems, Inc., Detroit Lakes, MN (US)

(*) Notice: Subject to any disclaimer, the term of this patent is extended or adjusted under 35 U.S.C. 154(b) by 0 days.

(21) Appl. No.: 14/301,534

(22) Filed: Jun. 11, 2014

(65) Prior Publication Data

US 2015/0364902 A1    Dec. 17, 2015

(51) Int. Cl.

| | | |
|---|---|---|
| *B65F 1/14* | (2006.01) | |
| *A47G 23/02* | (2006.01) | |
| *B65D 25/22* | (2006.01) | |
| *F16M 11/00* | (2006.01) | |
| *F16M 11/16* | (2006.01) | |
| *F16M 11/22* | (2006.01) | |
| *G06F 1/16* | (2006.01) | |
| *G06F 1/18* | (2006.01) | |
| *F21V 21/116* | (2006.01) | |
| *H02B 1/50* | (2006.01) | |
| *H05K 5/02* | (2006.01) | |

(52) U.S. Cl.
CPC ............. *H02B 1/50* (2013.01); *H05K 5/0234* (2013.01)

(58) Field of Classification Search
CPC ......... B65F 1/141; F16M 11/00; F16M 11/16; F16M 11/22; F16M 2200/08; G06F 1/1607; G06F 1/181; F21V 21/116; B65D 25/22

USPC ............................. 220/475; 248/151; 174/50
See application file for complete search history.

(56) References Cited

U.S. PATENT DOCUMENTS

| | | | | |
|---|---|---|---|---|
| 3,696,242 | A | * | 10/1972 | Patry ..................... F21S 8/088 248/219.2 |
| 4,368,842 | A | * | 1/1983 | DeLange, III ..... A47G 29/1209 232/17 |
| 5,899,420 | A | * | 5/1999 | Gerardi ......................... 248/146 |
| 6,116,556 | A | * | 9/2000 | Roth ....................... E04H 12/24 248/200.1 |

OTHER PUBLICATIONS

"PS Patrol™ system with 230V Pump & 120V Alarm Installation Instructions," SJE-Rhombus® Controls, 4 pages.
"Observer 100" Series Pedestal Alarm, SPI Septic Products, Inc., 2 pages.

* cited by examiner

*Primary Examiner* — Andrew T Kirsch
(74) *Attorney, Agent, or Firm* — Dicke, Billig & Czaja, PLLC (57) ABSTRACT

A electrical enclosure with interchangeable pedestal mounting system for an electrical enclosure that may be attached to different types of pedestals. The electrical enclosure with interchangeable pedestal mounting system generally includes a base having a mounting structure that allows for attachment of the base to at least two different pedestals. The mounting structure includes one or more support members that allow for attachment to a rectangular pedestal or a circular pedestal thereby allowing an installer to utilize their preferred pedestal type.

19 Claims, 13 Drawing Sheets

ELECTRICAL ENCLOSURE WITH INTERCHANGEABLE PEDESTAL MOUNTING SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

Field of the Invention

The present invention relates generally to electrical enclosures and more specifically it relates to an electrical enclosure with interchangeable pedestal mounting system for providing an electrical enclosure that may be attached to different types of pedestals.

Description of the Related Art

Any discussion of the related art throughout the specification should in no way be considered as an admission that such related art is widely known or forms part of common general knowledge in the field.

Electrical enclosures are utilized to house and protect electrical devices such as control units, switches, gauges, alarms, sensors, displays and the like. Electrical enclosures are utilized in various industries such as for alarms for pump switches. Electrical enclosures utilized outside of a building structure typically are mounted upon a pedestal or other structure to keep the electrical enclosure along with the electronics inside above the ground surface. Conventional electrical enclosures having a lower mounting structure that allows for mounting of the electrical enclosure to a single type of pedestal (e.g. a rectangular pedestal or a circular pedestal). Conventional electrical enclosures therefore require the installer to use a single type of pedestal when they may prefer to utilize a different type of pedestal.

Because of the inherent problems with the related art, there is a need for a new and improved electrical enclosure with interchangeable pedestal mounting system for an electrical enclosure that may be attached to different types of pedestals.

BRIEF SUMMARY OF THE INVENTION

The invention generally relates to an electrical enclosure which includes a base having a mounting structure that allows for attachment of the base to at least two different pedestals. The mounting structure includes one or more support members that allow for attachment to a rectangular pedestal or a circular pedestal thereby allowing an installer to utilize their preferred pedestal type.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto. In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Turning now descriptively to the drawings, in which similar reference characters denote similar elements throughout the several views, FIGS. 1 through 13 illustrate an electrical enclosure 10, which comprises housing having a base 30 and a cover 20 attached to the base 30. The electrical enclosure 10 further comprises a mounting structure that allows for attachment of the base 30 to at least two different pedestals. While the present mounting structure illustrated shows attachment of the electrical enclosure 10 to two different types of pedestals (a rectangular pedestal 12 and a circular pedestal 14), additional different shapes and sizes of pedestals may be attached to the present invention. For example, two or more different circular pedestals 14 having different diameters could be attached to the electrical enclosure 10. The mounting structure includes one or more support members that allow for attachment to a rectangular pedestal 12 or a circular pedestal 14 thereby allowing an installer to utilize their preferred pedestal type.

B. Housing

The housing for the electrical enclosure 10 is comprised of a cover 20, a base 30 and at least one mounting structure attached to the base 30 for mounting to different types of pedestals 12, 14. The housing is adapted to house and protect one or more electrical components within the electrical enclosure. The electrical enclosure 10 may be utilized to house and protect electrical devices such as control units, switches, gauges, alarms, sensors, displays and the like in various industries such as alarms for pump switches. The electrical enclosure 10 of the present invention is preferably designed to be positioned outside of a building structure where the electrical enclosure 10 is subject to the weather such as rain, snow, sun and wind. It is therefore important that the electrical enclosure 10 be mounted upon a pedestal 12, 14 to keep the electronics inside the electrical enclosure 10 above the ground surface 11.

Figure 1:
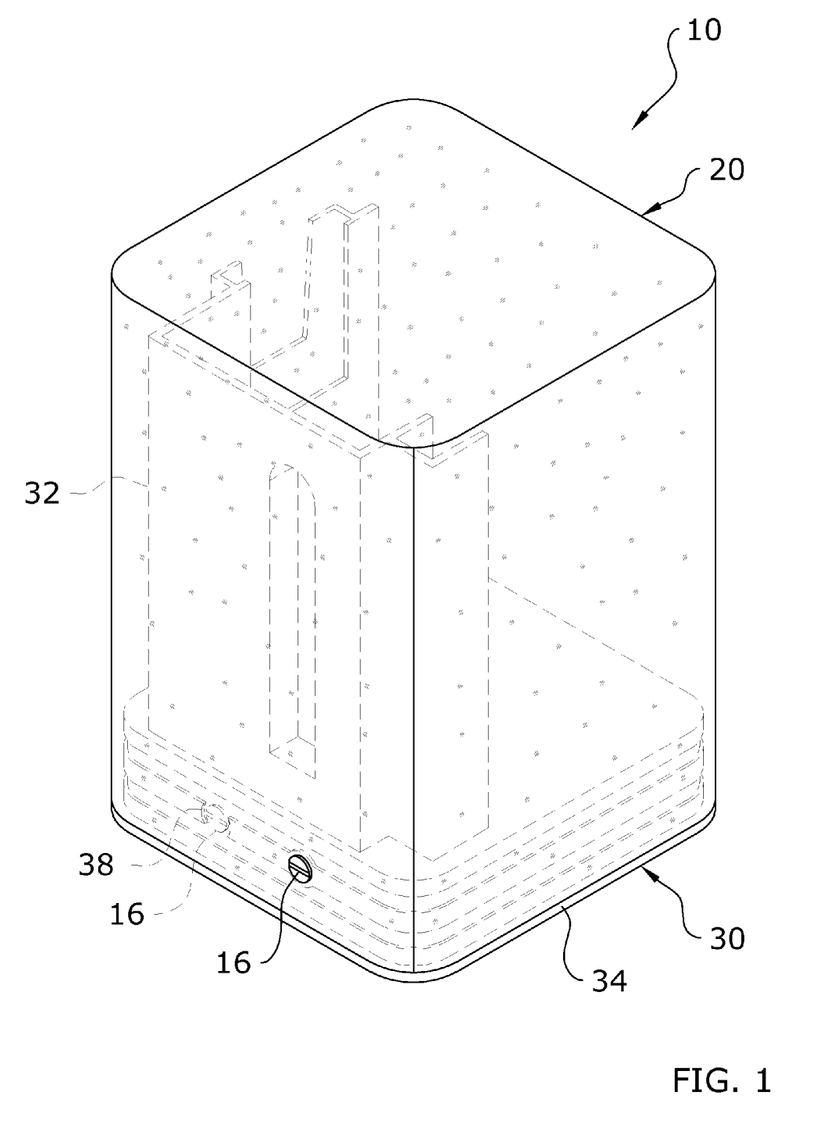
FIG. 1 is an upper perspective view of the present invention.
Figure 2:
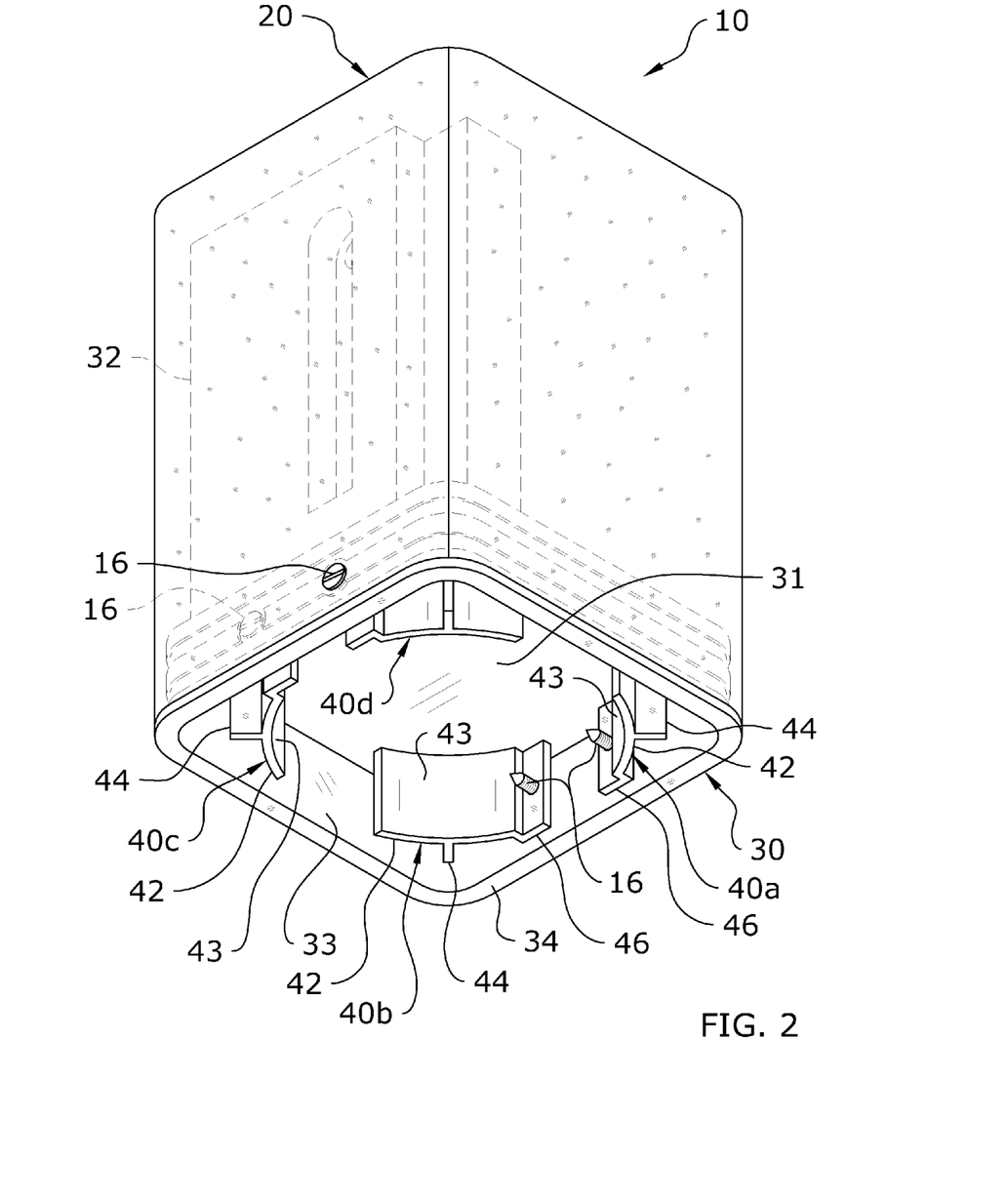
FIG. 2 is a lower perspective view of the present invention.
Figure 3:
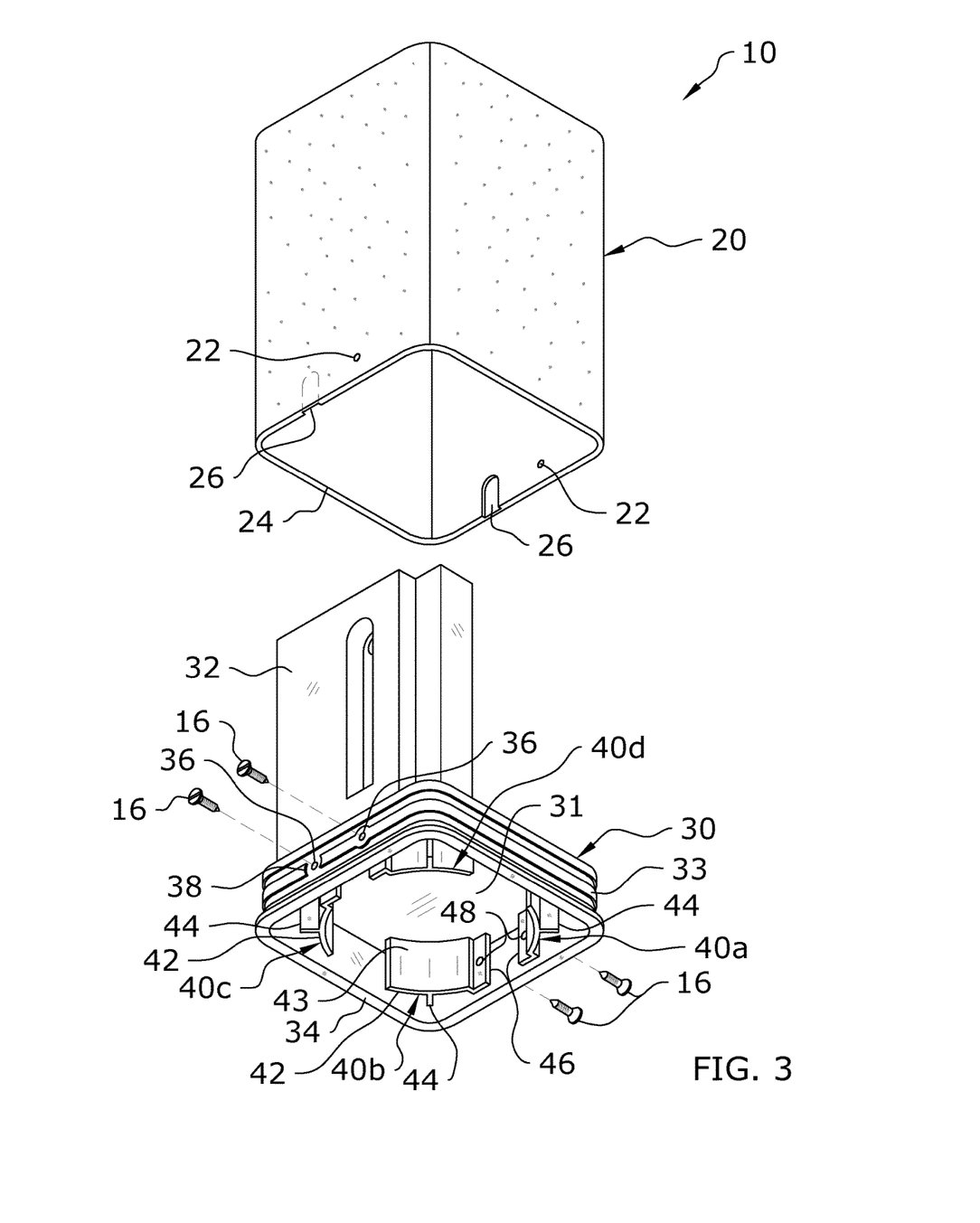
FIG. 3 is a lower exploded perspective view of the present invention.
Figure 4:
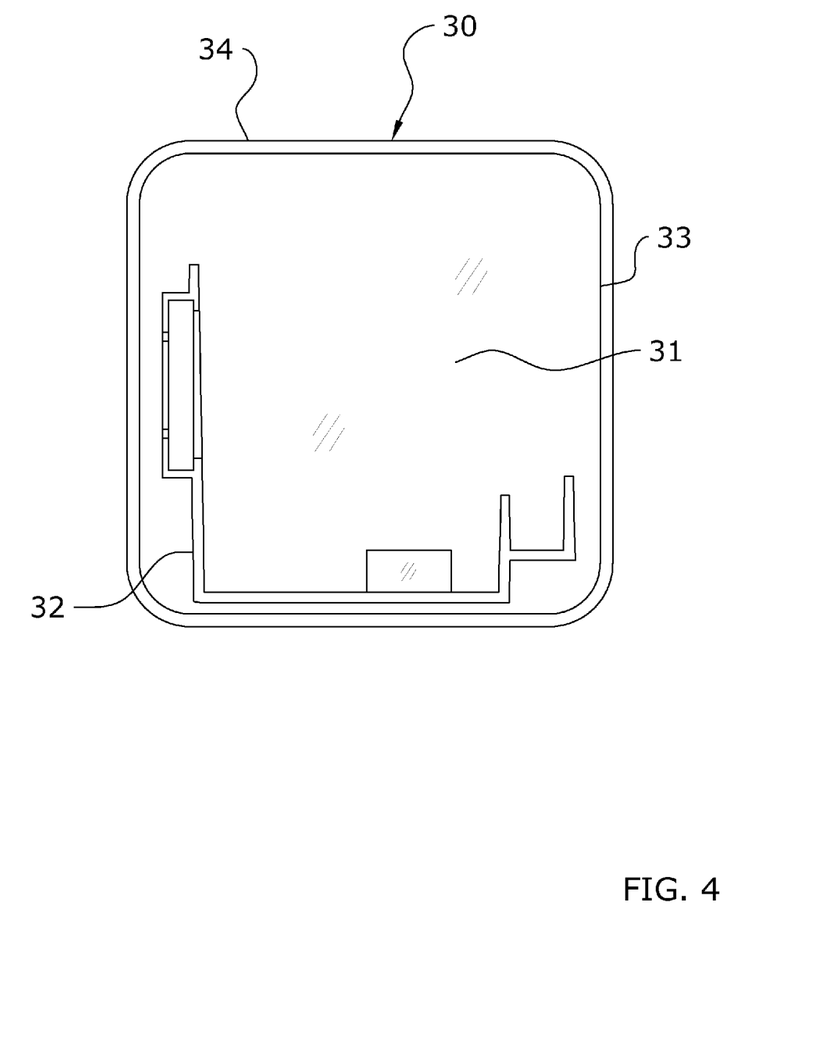
FIG. 4 is a top view of the present invention.

The cover 20 is preferably removably attached to the base 30 as illustrated in FIG. 3 of the drawings. However, the cover 20 may be permanently attached to the base 30 to form the housing of the electrical enclosure 10 defining an interior to house the one or more electrical components. The cover 20 may be comprised of various shapes and sizes, but it is preferable that the cover 20 have a lower opening 24 similar in shape and size to the base 30 to provide a snug and substantially sealed connection along the perimeter of the base 30. The cover 20 may be transparent or semi-transparent to allow for viewing of the interior of the cover 20 (to also allow for visual alarms such as lights to be used to indicate an alarm situation such as high water within a sump pit).

The cover 20 includes at least one first aperture 22 that receives a fastener 16 for securing the cover 20 to the base 30. As illustrated in FIG. 3, it is preferable to have at least two first apertures 22 on opposing sides of the cover 20 to secure both sides of the cover 20 to the base 30. The first apertures 22 of the cover 20 are aligned with corresponding second apertures 36 within the outer wall 33 of the base 30 that allow the fasteners 16 to extend through the base 30 into the mounting structure and/or the upper portion of the pedestal 12, 14 to secure the pedestal to the base 30. The cover 20 further preferably includes one or more channels 26 that extend upwardly from the perimeter of the lower opening 24 of the cover 20 along an interior surface of the cover 20 to provide additional space for the head of a fastener 16 that extends through the second aperture 36.

The base 30 is adapted to be attached to an upper end of a pedestal 12, 14. The base 30 includes a support portion 31 that extends generally horizontally between an outer wall 33 that defines the perimeter of the base 30. The support portion 31 is preferably planar and forms a floor for the electronic components housed in the electrical enclosure by the cover 20. The support portion 31 further forms a ceiling for the recessed portion 38 that receives the pedestal 12, 14.

The outer wall 33 extends downwardly from the support portion 31 of the base 30 to form a cavity 35 that receives the upper end of the pedestal 12, 14. The base 30 preferably has a rectangular shape, but it can be appreciated that various other shapes may be utilized for the base 30 that are capable of receiving different shaped pedestals 12, 14. The base 30 further includes an electronics support 32 that extends upwardly from the support portion 31 to support various electronic devices such as alarms (audible or visual), control units, switches and the like. The outer wall 33 further includes a flanged end 34 at the lower distal end of the outer wall 33 that the lower distal end of the cover 20 engages when positioned upon the base 30.

Figure 6:
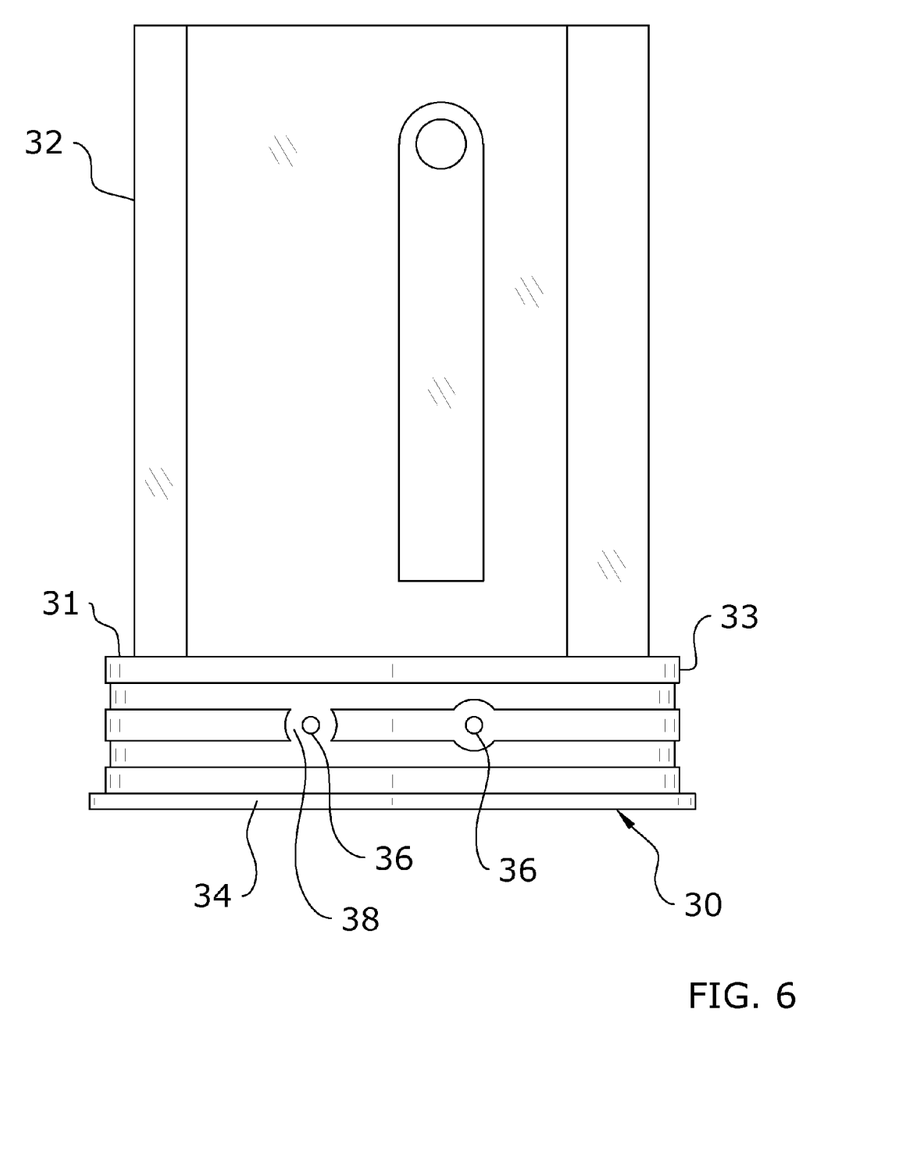
FIG. 6 is a front view of the present invention.

The base 30 includes at least one second aperture 36 within the outer wall 33 that receives a corresponding fastener 16 as illustrated in FIGS. 3 and 6 of the drawings. It is preferable to have a plurality of second apertures 36 within the outer wall 33 to receive a corresponding number of fasteners 16 thereby securing both the cover 20 and the base 30 to the pedestal 12, 14. One or more of the second apertures 36 includes a recessed portion 38 that receives the head of the fastener 16 thereby allowing the cover 20 to slide over the fastener 16 (in addition, the channel 26 within the cover 20 is preferably aligned with the same second aperture 36 to prevent engagement of the cover 20 with the head of the fastener 16 thereby allowing securing of the base 30 to the pedestal without having to attach the cover 20).

C. Mounting Structure

Figure 9:
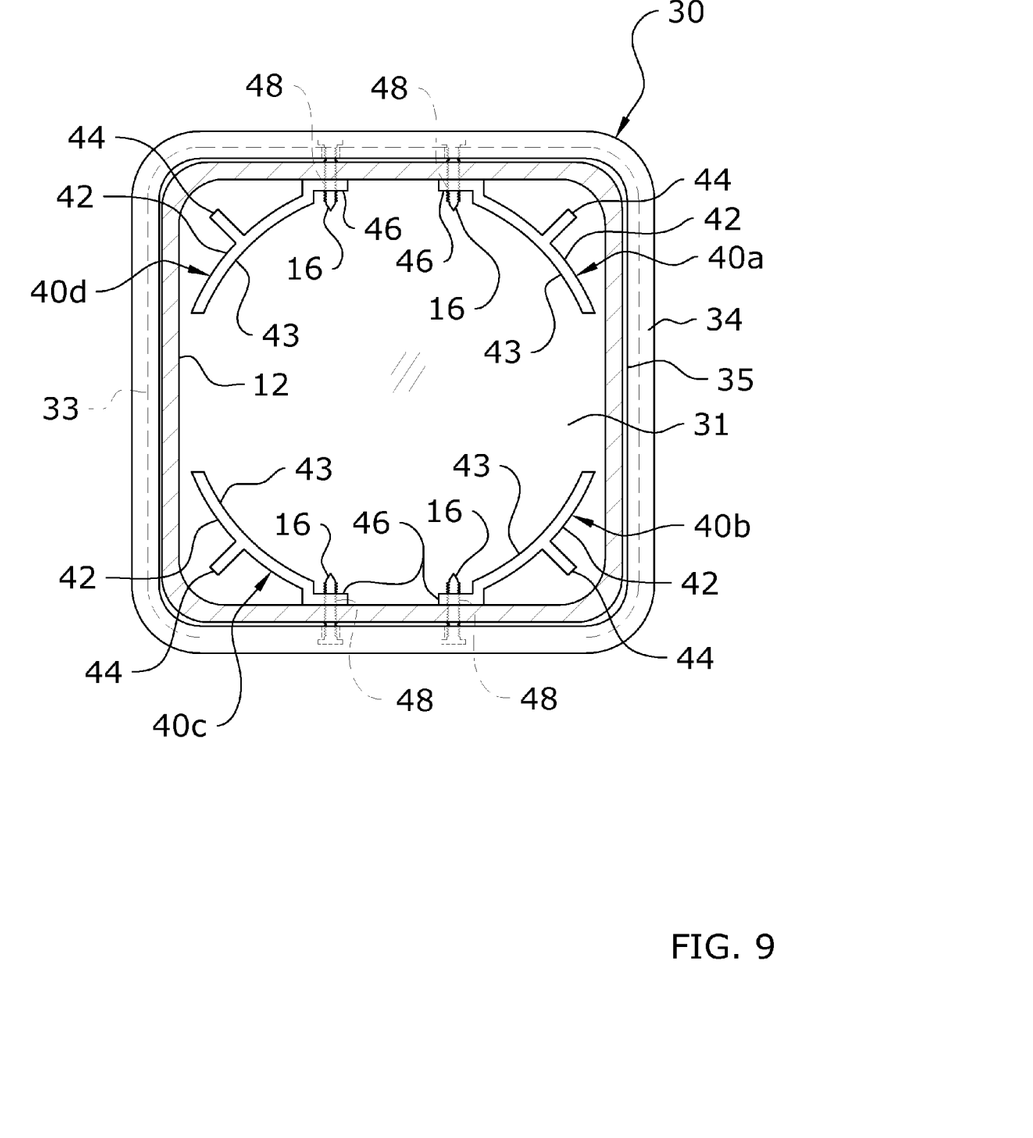
FIG. 9 is a cross sectional view taken along line 9-9 of FIG. 8.
Figure 12:
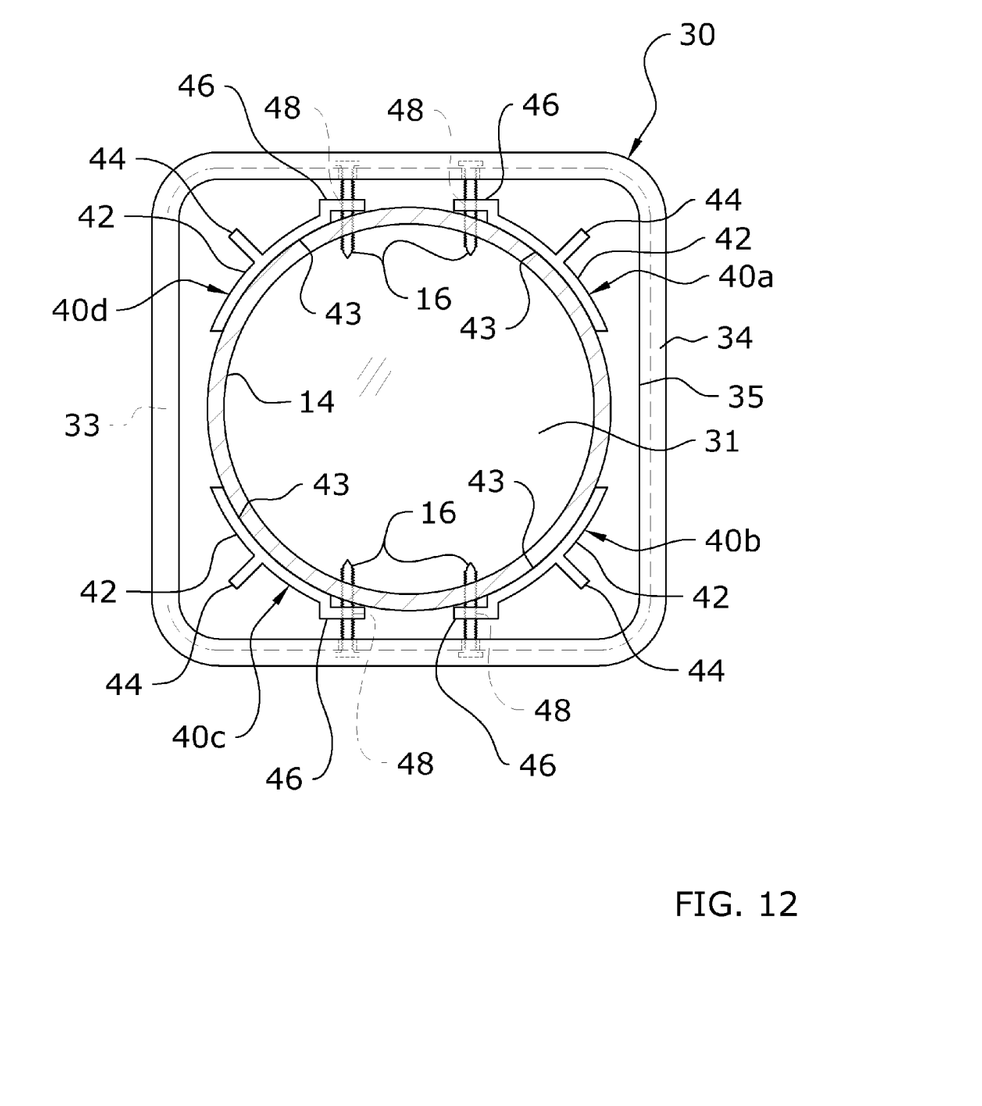
FIG. 12 is a cross sectional view taken along line 12-12 of FIG. 11.
Figure 13:
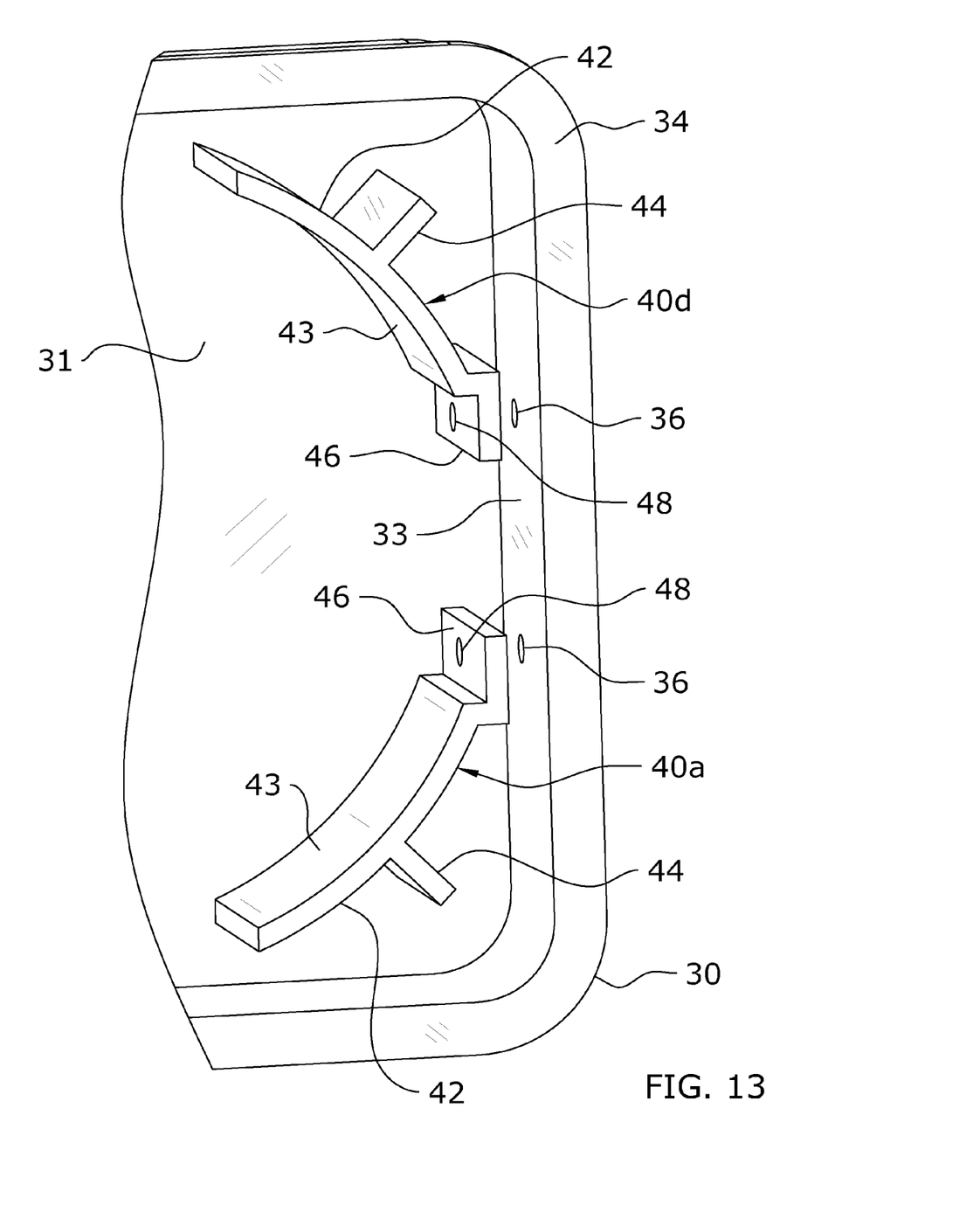
FIG. 13 is a magnified lower perspective view of the base illustrating the support members.

The base 30 includes a mounting structure that is adapted to attach at least two different types of pedestals 12, 14. The pedestals 12, 14 are typically constructed of plastic (e.g. polyvinyl chloride a.k.a. PVC) such as PVC pipes. The pedestals 12, 14 are comprised of a structure and material that allows for the attachment of the base 30 thereto with conventional fasteners 16 (e.g. metal screws, bolts, threaded fasteners 16). Different types of pedestals includes pedestals having different cross sectional shapes (e.g. rectangular pedestal 12 as illustrated in FIG. 9 or a circular pedestal 14 as illustrated in FIG. 12). In addition, different types of pedestals includes pedestals having different sizes (e.g. different diameters, different widths).

It preferable that the mounting structure is adapted for attaching either a circular pedestal 14 or a rectangular pedestal 12 to the base 30 as illustrated in FIGS. 7 through 12 of the drawings. A single mounting structure may be utilized for attaching two or more types of pedestals, or a plurality of mounting structures may be utilized for attaching two or more types of pedestals. For example, a first mounting structure and a second mounting structure could be attached to the base 30, wherein the first mounting structure is adapted to attach a first type of pedestal to the base 30 and the second mounting structure is adapted to attach a second type of pedestal to the base 30.

The mounting structure is preferably comprised of at least one support member 40a, 40b, 40c, 40d having a first portion 42 having a curved surface 43 adapted to receive the circular pedestal 14 and a second portion 46 having a straight surface adapted to receive the rectangular pedestal 12. The first portion 42 may extend to form a complete circle that receives the circular pedestal 14. The first portion 42 preferably has an interior diameter approximately the same as the outer diameter of the circular pedestal 14 so that a curved surface 43 (interior) of the first portion 42 snugly receives the upper end of the circular pedestal 14. It can be appreciated that the first portion 42 may also have an exterior diameter approximately the same as the interior diameter of the circular pedestal 14 so that the curved surface 43 (exterior) of the first portion 42 snugly fits within the upper opening of the circular pedestal 14.

Figure 5:
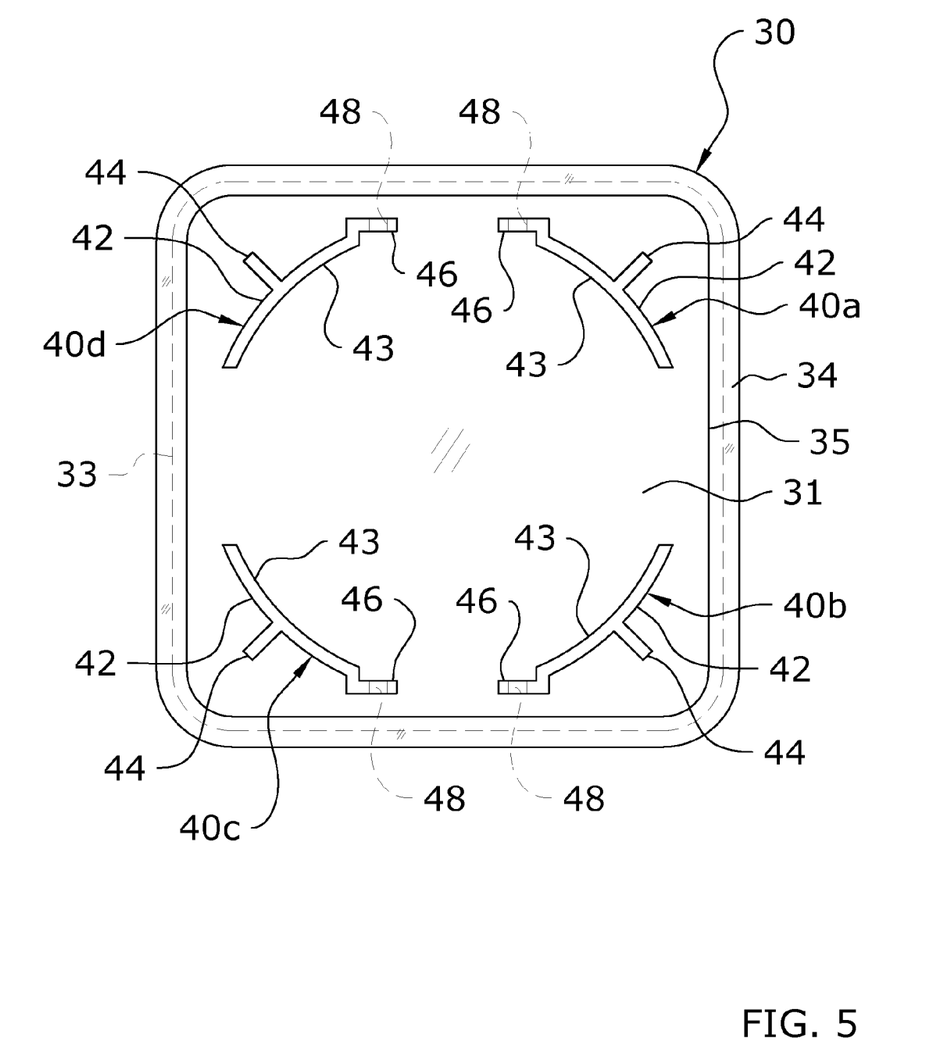
FIG. 5 is a bottom view of the present invention.

FIGS. 5, 9 and 12 best illustrate where it is preferable to have four support members 40a-b extending downwardly from the lower surface of the support portion 31 of the base 30. Each of the support members is preferably comprised of a first portion 42 and a second portion 46. The first portion 42 is preferably connected to the second portion 46, however the second portion 46 may be separate from the first portion 42. The first portion 42 has a curved surface 43 that faces inwardly that receives the outer surface of the circular pedestal 14 (or that faces outwardly when being positioned within the interior surface of the lumen of the circular pedestal 14).

The second portion 46 preferably extends from the first portion 42 and has a straight surface that faces outwardly to fit within the interior surface of the upper end of the rectangular pedestal 12. The interior surface of the outer wall 33 preferably is shaped and sized to receive the outer surface of the upper end of the rectangular pedestal 12 thereby retaining the upper end of the rectangular pedestal 12 between the second portion 46 and the outer wall 33. The second portion 46 is preferably parallel with a portion of the outer wall 33 nearest to the second portion 46 as best illustrated in FIG. 5 of the drawings. The distance between the second portion 46 and the outer wall 33 is approximately the thickness of the wall of the rectangular pedestal 12.

One or more of the support members 40a-b includes one or more securing apertures 48 that are preferably aligned with the second apertures 36 within the base 30 to receive a corresponding fastener 16. The securing apertures 48 are further preferably positioned within the second portion 46 of the support members 40a-b, however, it can be appreciated that the securing apertures 48 may extend through the first portion 42.

To provide additional support to the support members 40a-b, a brace portion 44 extends from the support portion 31 of the base 30 and is attached to the support members. The brace portion 44 for each of the support members 40a-b preferably extends towards a respective adjacent interior corner of the outer wall 33 to avoid interfering with the insertion of the rectangular pedestal 12 as illustrated in FIG. 5 of the drawings.

D. Operation of Preferred Embodiment

In use, the install of the electrical enclosure 10 identifies the location of installation and the type of pedestal 12, 14 they prefer to utilize. The installer attaches the selected pedestal to the ground surface 11 utilizing conventional attachment methods (e.g. burying the lower end within the ground surface 11). Once the pedestal 12, 14 is properly secured to the ground surface 11, the installer then positions the base 30 upon the upper end of the pedestal 12, 14 and then inserts one or more fasteners 16 through the outer wall 33 of the base 30 into the pedestal 12, 14. Once the base 30 is secured to the pedestal 12, 14, the user then positions the cover 20 upon the base 30 and secures the cover 20 by inserting one or more fasteners 16 through the first apertures 22 within the cover 20 through the second apertures 36 and the through the pedestal 12, 14. The fasteners 16 may or may not extend through the support members 40a-b. Prior to installation, one or more openings may be created within the support portion 31 (either by the installer or by the manufacturer) to allow for wires to pass from electrical enclosure 10 downwardly through the support portion 31 for connection to sensors, switches and the like externally positioned of the electrical enclosure.

Figure 7:
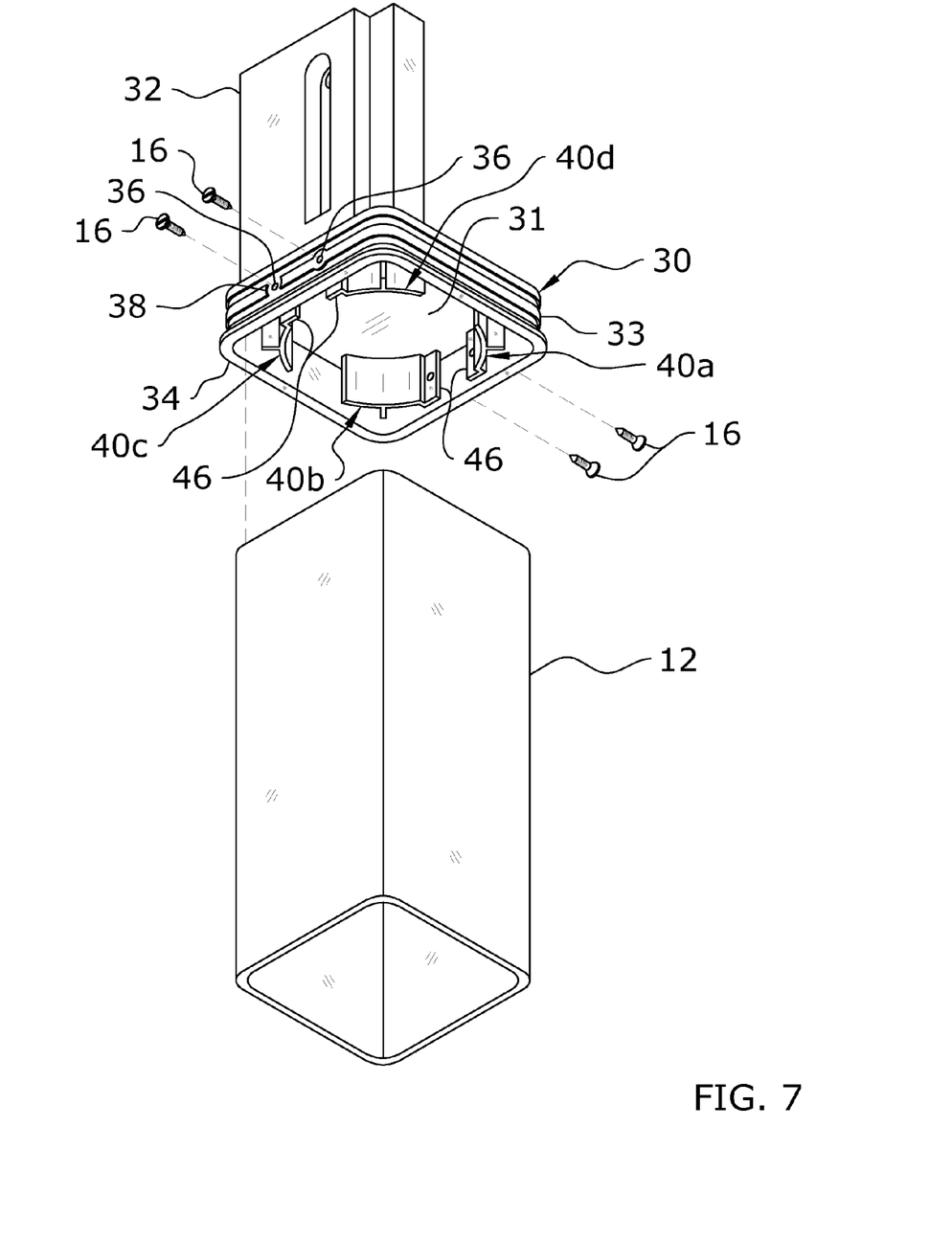
FIG. 7 is an exploded lower perspective view of the present invention with respect to a rectangular pedestal.
Figure 8:
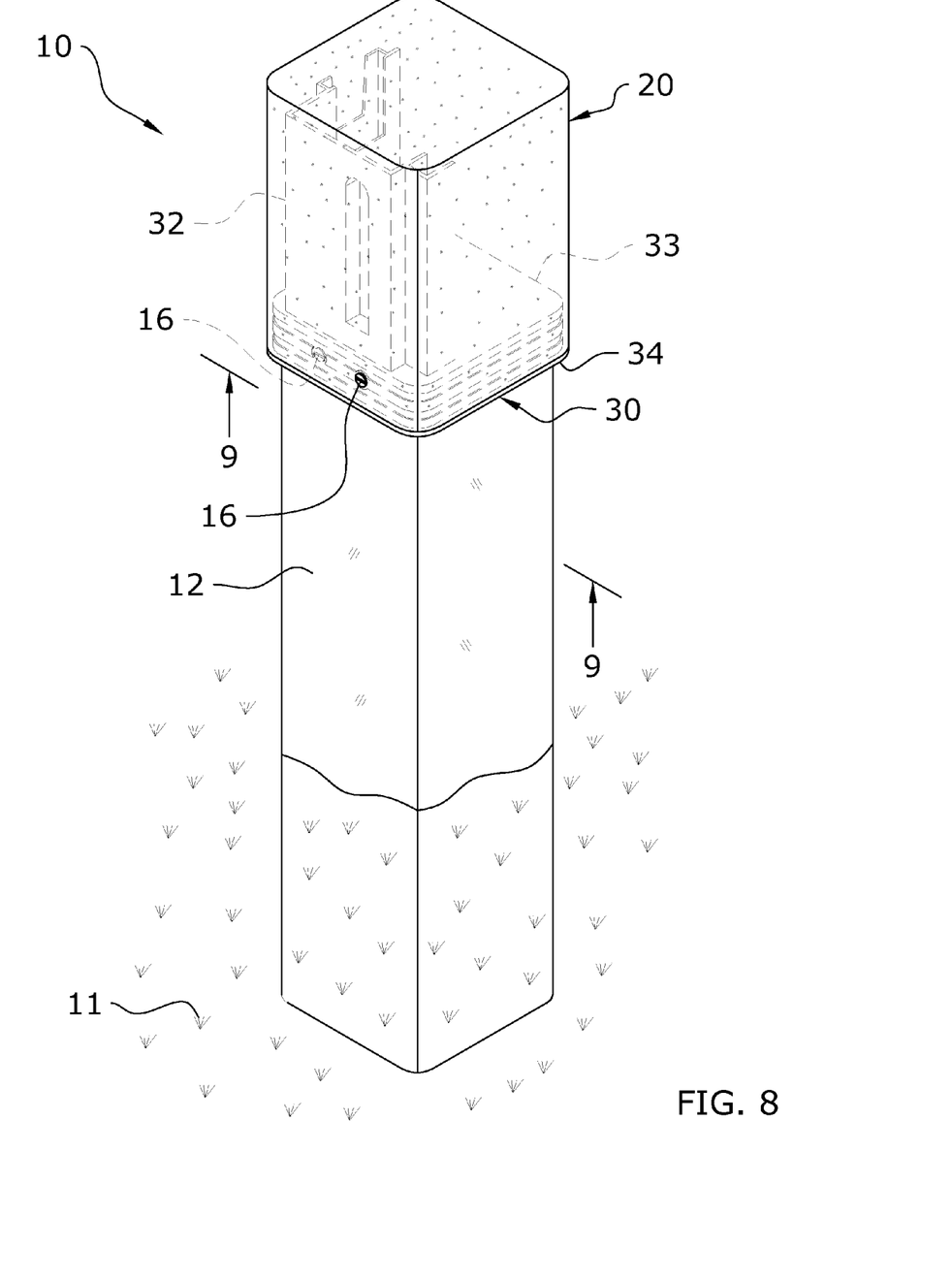
FIG. 8 is an upper perspective view of the present invention attached to the upper end of the rectangular pedestal.

FIGS. 7 through 9 illustrate attaching the base 30 to a rectangular pedestal 12. As illustrated in FIG. 9 of the drawings, the rectangular pedestal 12 fits between the second portions 46 of the support members 40a-b and the fasteners 16 extend through the base 30 then through the rectangular pedestal 12 and then through the second portions 46 of the support members 40a-b.

Figure 10:
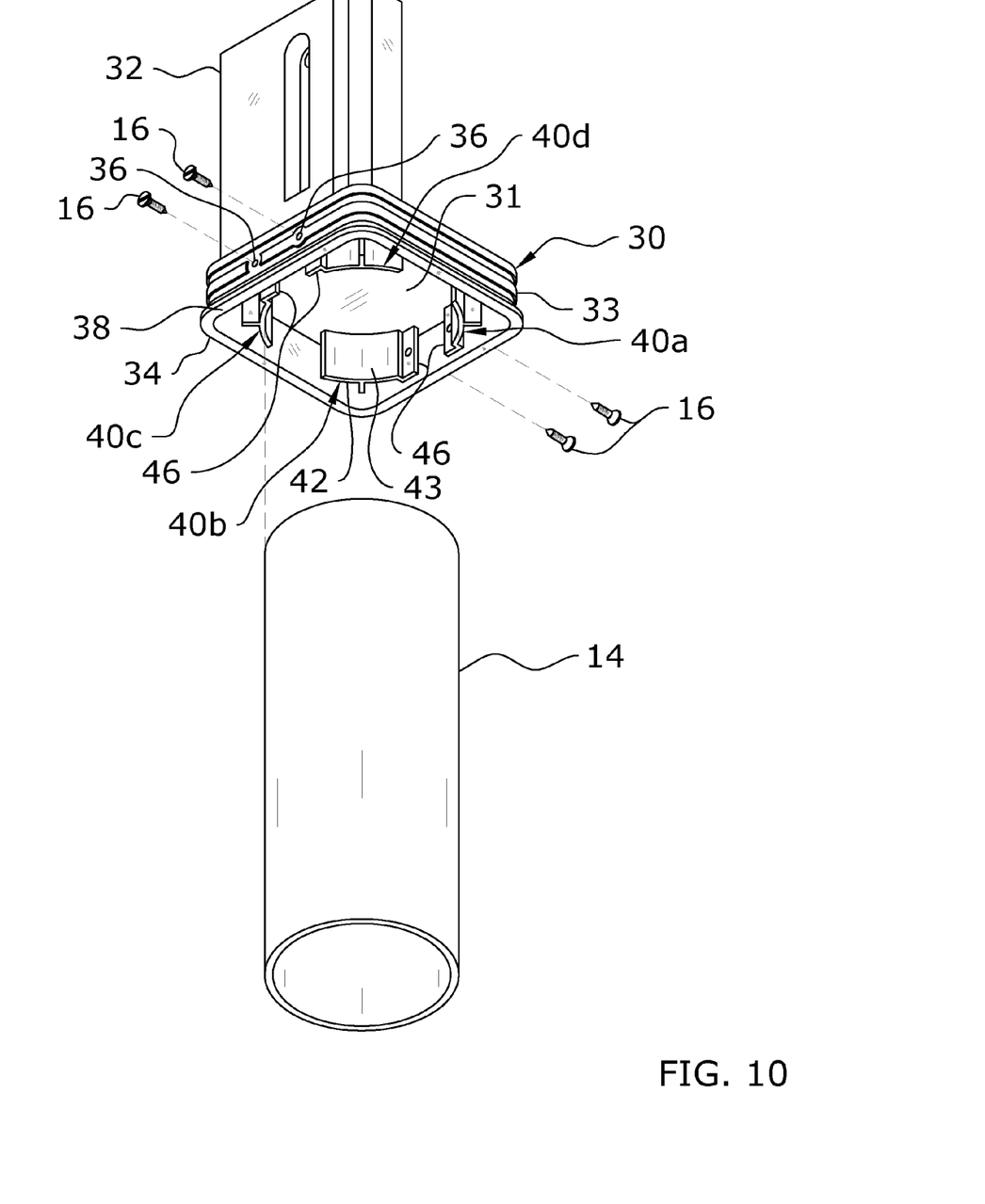
FIG. 10 is an exploded lower perspective view of the present invention with respect to a circular pedestal.
Figure 11:
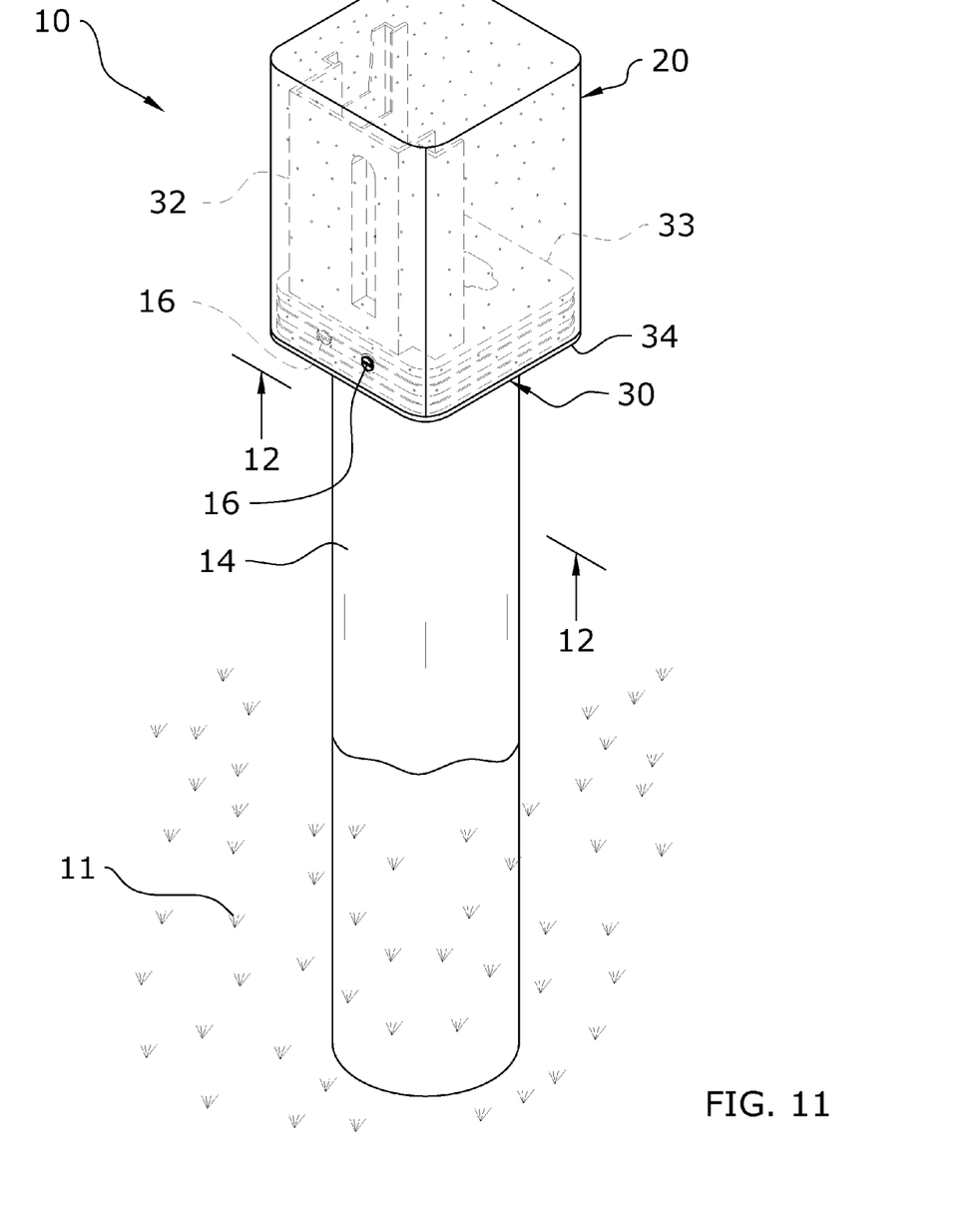
FIG. 11 is an upper perspective view of the present invention attached to the upper end of the circular pedestal.

FIGS. 10 through 12 illustrate attaching the base 30 to a circular pedestal 14 instead of a rectangular pedestal 12. As illustrated in FIG. 12 of the drawings, the circular pedestal 14 fits inside of the first portions 42 of the support members 40a-b adjacent to the curved surface 43 (interior) of the first portions 42. The fasteners 16 extend through the base 30 then through the circular pedestal 14 and then through the second portions 46 of the support members 40a-b.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods and materials are described above. All publications, patent applications, patents, and other references mentioned herein are incorporated by reference in their entirety to the extent allowed by applicable law and regulations. The present invention may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

The invention claimed is:

1. An electrical enclosure, comprising:
   a cover;
   a base having a support portion about which an outer wall extends forming a cavity;
   a mounting structure attached to said support portion and extending outwardly therefrom within said cavity, wherein said mounting structure includes a support member having a curved surface and a straight surface and is adapted to operatively connect to one of at least two different types of pedestals to said base, the curved surface having a concave curvature relative to a vertical central axis of the pedestal, wherein said curved surface faces inwardly and is adapted to receive one of the at least two different types of pedestals within the curved surface; and
   a first fastener adapted to operatively connect the cover and the mounting structure to the pedestal.

2. The electrical enclosure of claim 1, wherein said straight surface faces outwardly and is adapted to receive one of the at least two different types of pedestals between the straight surface and the outer wall.

3. The electrical enclosure of claim 1, wherein the mounting structure is adapted to operatively connect each of a first type of pedestal and a second type of pedestal separately to the base, the first type of pedestal being different from the second type of pedestal.

4. The electrical enclosure of claim 3, wherein the first fastener extends through the cover and the base and into the first type of pedestal.

5. The electrical enclosure of claim 3, wherein the first fastener extends through the cover, the second type of pedestal, and the base.

6. The electrical enclosure of claim 1, further comprising a second fastener, the second fastener adapted to operatively connect the base to one of the at least two different types of pedestals.

7. The electrical enclosure of claim 6, wherein the cover includes a channel configured and arranged to receive the second fastener.

8. The electrical enclosure of claim 1, wherein the straight surface is parallel with the outer wall.

9. An electrical enclosure, comprising:
   a base including a support portion;
   an outer wall extending downwardly from said support portion, wherein said support portion and said outer wall define a cavity adapted for receiving a pedestal;
   a mounting structure attached to said support portion, the mounting structure adapted to receive one of at least two different types of pedestals, the mounting structure including a curved surface adapted to receive a circular pedestal proximate an inner surface of the mounting structure and a straight surface adapted to receive a rectangular pedestal proximate an outer surface of the mounting structure between the mounting structure and the outer wall, the curved surface having a concave curvature relative to a vertical central axis of the pedestal, the straight surface being parallel with the outer wall;

a first fastener adapted to operatively connect the straight surface to the one of the at least two different types of pedestals.

10. The electrical enclosure of claim 9, wherein said curved surface faces inwardly.

11. The electrical enclosure of claim 9, wherein said straight surface faces outwardly.

12. The electrical enclosure of claim 9, wherein the straight surface is operatively connected to the curved surface.

13. The electrical enclosure of claim 9, wherein the mounting structure includes at least one support member including the curved surface and the straight surface being operatively connected to the curved surface.

14. The electrical enclosure of claim 9, wherein the mounting structure includes four separate support members, each support member including a respective curved surface and a respective straight surface being operatively connected to the respective curved surface.

15. The electrical enclosure of claim 9, further comprising a cover and a second fastener, the second fastener adapted to operatively connect the cover and the base to the pedestal.

16. An electrical enclosure, comprising:

a housing comprised of a base and a cover, wherein said base includes an outer wall adapted to be attached to an upper end of a pedestal and wherein said cover is attached to said base defining an interior to house one or more electrical components;

a mounting structure attached to said housing, wherein said mounting structure includes at least one support member adapted to attach the pedestal to said base, the at least one support member having a curved surface and a straight surface, the curved surface having a concave curvature relative to a vertical central axis of the pedestal, the pedestal including at least two different types of pedestals and the mounting structure adapted to attach the at least two different types of pedestals to said base one at a time, said mounting structure being adapted to receive a first pedestal within said mounting structure and adapted to receive a second pedestal between said mounting structure and said outer wall;

a first fastener connecting the mounting structure to the pedestal, the first fastener extending through the mounting structure and the pedestal; and a second fastener connecting the cover and the mounting structure to the pedestal, the second fastener extending through the cover, the mounting structure, and the pedestal.

17. The electrical enclosure of claim 16, wherein said at least one support member includes a first portion having a curved surface adapted to receive a circular pedestal within said mounting structure and a second portion having a straight surface adapted to receive a rectangular pedestal between said mounting structure and said outer wall.

18. The electrical enclosure of claim 17, wherein the straight surface is parallel with the outer wall.

19. The electrical enclosure of claim 16, wherein said at least one support member is comprised of a plurality of support members extending downwardly from said base.

* * * * *